(12) United States Patent
Chou

(10) Patent No.: US 7,378,345 B2
(45) Date of Patent: May 27, 2008

(54) METAL ELECTROPLATING PROCESS OF AN ELECTRICALLY CONNECTING PAD STRUCTURE OF CIRCUIT BOARD AND STRUCTURE THEREOF

(75) Inventor: Pao Hung Chou, Hsin-chu (TW)

(73) Assignee: Phoenix Precision Technology Corporation, Hsin-chu (TW)

( * ) Notice: Subject to any disclaimer, the term of this patent is extended or adjusted under 35 U.S.C. 154(b) by 3 days.

(21) Appl. No.: 11/447,584

(22) Filed: Jun. 5, 2006

(65) Prior Publication Data

US 2006/0272148 A1 Dec. 7, 2006

(30) Foreign Application Priority Data

Jun. 7, 2005 (TW) ............................. 94118704 A

(51) Int. Cl.
  *H01L 21/44* (2006.01)
  *H05K 1/00* (2006.01)
(52) U.S. Cl. .................. 438/678; 361/751; 29/825; 439/709
(58) Field of Classification Search .......... 438/617, 438/670, 678; 29/825; 361/736, 748, 750, 361/751; 439/709
See application file for complete search history.

(56) References Cited

U.S. PATENT DOCUMENTS 6,673,711 B2* 1/2004 Tong et al. ................. 438/613

2004/0099961 A1* 5/2004 Chu et al. ................... 257/781
2006/0055023 A1* 3/2006 Ho et al. .................... 257/692
2006/0125075 A1* 6/2006 Liao et al. .................. 257/690

* cited by examiner

Primary Examiner—W. David Coleman
(74) Attorney, Agent, or Firm—Sawyer Law Group, LLP

(57) ABSTRACT

A metal electroplating process of an electrically connecting pad structure of a circuit board and structure thereof are proposed. First, a circuit board with a patterned circuit layer formed on at least one surface thereof is provided, wherein the circuit layer defines a plurality of electrically connecting pads and electroplating lines connected to the electrically connecting pads. Then, a patterned resist layer is formed on the circuit layer of the circuit board with the electroplating lines being covered by the patterned resist layer and the electrically connecting pads being exposed from the patterned resist layer. Subsequently, an electroplating process is performed so as to form a metal protection layer on the electrically connecting pads exposed from the patterned resist layer. Then, the resist layer is removed and a solder mask layer is formed on the circuit board. The electrically connecting pads with the metal protection layer thereon and the electroplating lines are exposed from the solder mask layer. Afterwards, the electroplating lines that are not covered by the metal protection layer and exposed from the solder mask layer are removed such that a broken circuit can be formed between the electrically connecting pads and the electroplating lines. Therefore, metal permeation of the prior art is avoided and product yield is increased.

8 Claims, 3 Drawing Sheets

METAL ELECTROPLATING PROCESS OF AN ELECTRICALLY CONNECTING PAD STRUCTURE OF CIRCUIT BOARD AND STRUCTURE THEREOF

CROSS-REFERENCE TO RELATED APPLICATIONS

This application claims benefit under 35 USC 119 of Taiwan Application No. 094118704, filed Jun. 7, 2005.

FIELD OF THE INVENTION

The present invention relates to a metal electroplating process of an electrically connecting pad structure of circuit boards, and more particularly to electroplating a Ni/Au layer on exposed surface of electrically connecting pads of circuit boards.

BACKGROUND OF THE INVENTION

In general, a circuit board comprises a plurality of conductive circuits made of such as copper. For electronic signal transmission or power signal transmission, a plurality of electrically connecting pads is extended from the conductive circuits. Furthermore, a Ni/Au layer can be formed on the exposed surface of the electrically connecting pads such that conductive components such as gold wires and solder balls can effectively be coupled to the electrically connecting pads through the Ni/Au layer. In addition, the Ni/Au layer can effectively isolate the electrically connecting pads from ambient air and thus protect the electrically connecting pads from being oxidized by the ambient air. The electrically connecting pads can be such as bonding fingers with a Ni/Au layer formed thereon. During a wire bonding process, since the gold wires and the Ni/Au layer of the bonding fingers comprises same material, the gold wires and the bonding fingers can be electrically coupled together. The electrically connecting pads also can be bump pads or ball pads with a Ni/Au layer formed thereon. The Ni/Au layer can protect the bump pads or the ball pads made of such as copper from being oxidized by ambient air, thereby improving electrical connection quality between the bump pads or ball pads and bumps or balls mounted to the bump pads or ball pads.

FIGS. 1A to 1C show a conventional metal electroplating process. As shown in FIG. 1A, a circuit board 1 having a patterned circuit layer 11 defined thereon is provided and a solder mask layer 12 is formed on the circuit board 1. The solder mask layer 12 has a plurality of openings 12a such that electrically connecting pads 110 and electroplating lines 111 of the circuit layer 11 can be exposed from the openings 12a. Therein, the electroplating lines 111 are used as a current conductive path in a subsequent electroplating process. As shown in FIG. 1B, a patterned resist layer 13 having a plurality of openings 131 is formed on the circuit board 1 such that the electroplating lines 111 can be covered by the patterned resist layer 13 while the electrically connecting pads 110 can be exposed from the openings 131. By using the electroplating lines 111 as a current conductive path, an electroplating process is performed. As a result, a Ni/Au layer 14 is formed on the electrically connecting pads 110 exposed from the solder mask layer 13. After the resist layer 13 is removed, an etching process is performed so as to remove the electroplating lines 111 that are not covered by the Ni/Au layer, thereby cutting off the electrical connection between the electroplating lines 111 and the electrically connecting pads 110.

According to the above process, since the resist layer 13 needs to be deposited on the preformed solder mask layer 12 and the electroplating lines 111 having different height at the same time, it becomes impossible to make the patterned resist layer 13 closely attached to the electroplating lines 111. Instead, the lower portion of the resist layer 13 formed on the electroplating lines 111 becomes narrower than the upper portion of the resist layer 13. Accordingly, during the subsequent electroplating process, the Ni/Au material is easy to permeate into the electroplating lines 111 underneath the resist layer 13, thereby forming a permeation portion 14a on the electroplating lines 111, as shown in FIG. 1c. Because the electroplating lines 111 with the permeation portion 14a thereon is difficult to be removed by etching, electrical connection between the electrically connecting pads and the electroplating lines can not be efficiently cut off. As a result, electrical performance of the circuit board and the product yield are adversely affected.

Accordingly, there is a need to develop a metal electroplating process which can efficiently prevent permeation of Ni/Au material to the electroplating lines in the prior art.

SUMMARY OF THE INVENTION

In view of the above-mentioned problems of the prior art, an objective of the present invention is to provide a metal electroplating process of an electrically connecting pad structure of a circuit board and structure thereof which can electroplate a metal protection layer on electrically connecting pads by using electroplating lines as a current conductive path without causing such problems as metal permeation and short circuit.

To achieve the above and other objectives, the present invention discloses a metal electroplating process of an electrically connecting pad structure of a circuit board, which comprises the steps of: providing a circuit board with a patterned circuit layer formed on at least one surface thereof, wherein the circuit layer defines a plurality of electrically connecting pads and electroplating lines connected to the electrically connecting pads; forming a patterned resist layer on the circuit layer of the circuit board with the electroplating lines being covered by the patterned resist layer and the electrically connecting pads being exposed from the patterned resist layer; performing an electroplating process so as to form a metal protection layer on the electrically connecting pads exposed from the patterned resist layer; removing the resist layer; forming a solder mask layer on the circuit board, the electrically connecting pads with the metal protection layer thereon and the electroplating lines being exposed from the solder mask layer; and removing the electroplating lines that are not covered by the metal protection layer and exposed from the solder mask layer such that a broken circuit can be formed between the electrically connecting pads and the electroplating lines.

To achieve the above and other objectives, the present invention discloses a metal electroplating process of an electrically connecting pad structure of a circuit board: a circuit board having a patterned circuit layer formed on at least one surface thereof, the circuit layer having a plurality of electrically connecting pads and electroplating lines connected to the electrically connecting pads; metal protection layers formed on the electrically connecting pads; and a solder mask layer formed on the circuit board, wherein the metal protection layer is partially exposed from the solder mask layer.

Thereafter, a semiconductor component can be mounted to the circuit board and electrically connected to an external device through the circuit board. The patterned resist layer can be formed through a stencil printing process.

Compared with the prior art that needs to form the resist layer on the solder mask layer and the electroplating lines exposed from the solder mask layer having different height, the present invention directly forms the resist layer on the circuit layer. Thus, the height between the stencil and the circuit layer is decreased. The compact resist layer formed on the electrically conductive lines is closely attached to the electrically conductive lines, which effectively preventing the permeation of the electroplating material to the electroplating lines. As a result, the electroplating lines can easily be removed by etching and a broken circuit can be formed between the electrically connecting pads and the electroplating lines. Therefore, such problems of the prior art as short circuit, low electrical performance of the circuit board and low product yield are avoided.

DETAILED DESCRIPTION OF PREFERRED EMBODIMENTS

Hereunder, embodiments of the present invention will be described in full detail with reference to the accompanying drawings.

FIGS. 2A to 2F are sectional diagrams showing a metal electroplating process of an electrically connecting pad structure of a circuit board according to the present invention.

Figure 1A:
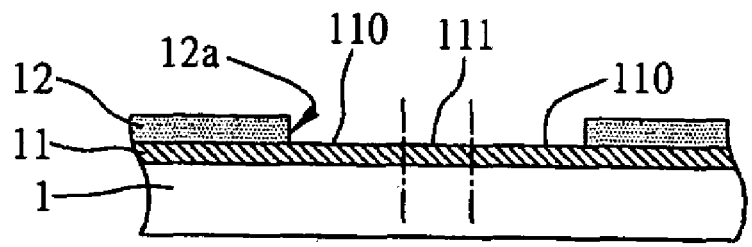
FIGS. 1A to 1C are sectional diagrams showing a conventional Ni/Au electroplating process.
Figure 1B:
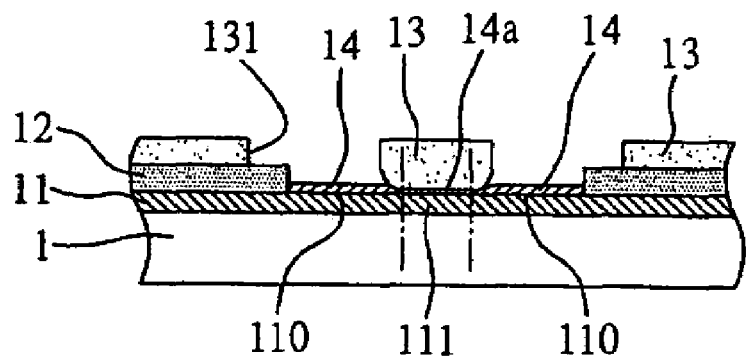
Figure 1C:
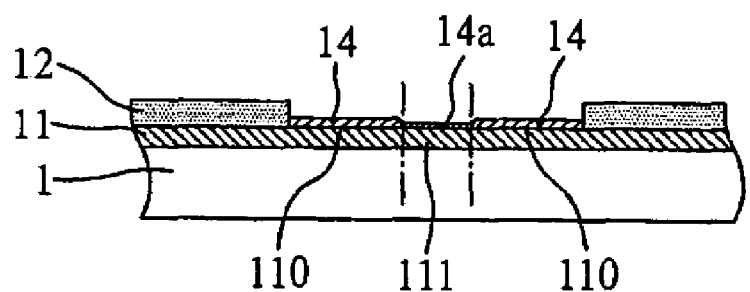
Figure 2A:
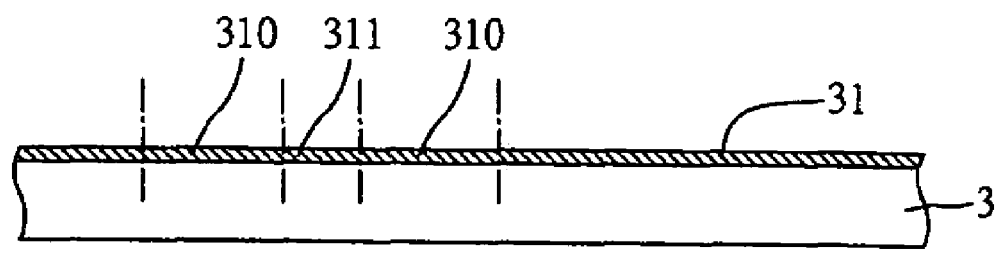
FIGS. 2A to 2F are sectional diagrams showing a metal electroplating process of an electrically connecting pad structure of a circuit board according to the present invention.
Figure 2B:
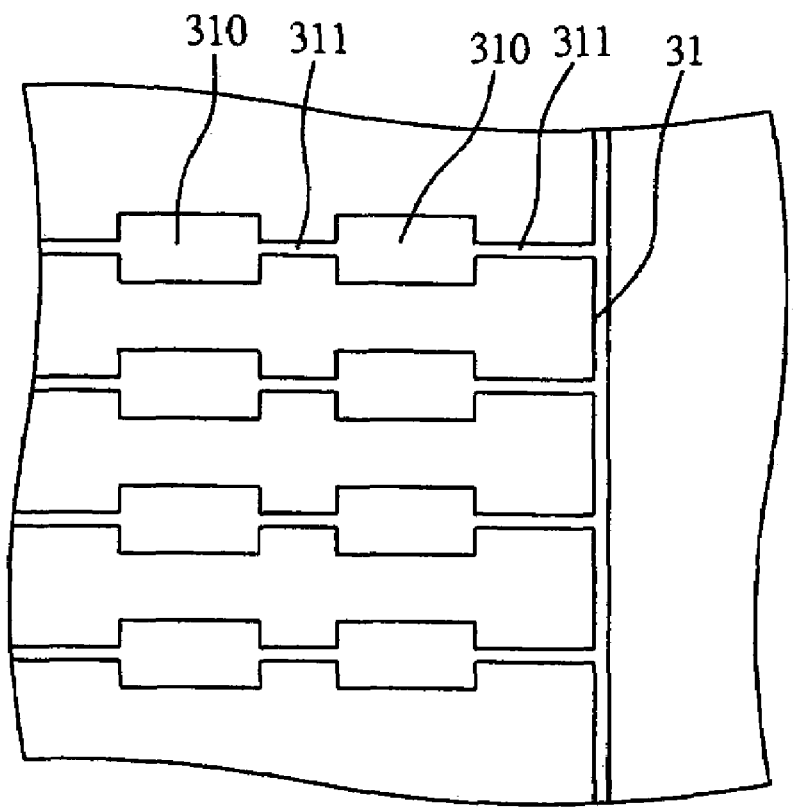

Referring to FIGS. 2A and 2B, a circuit board 3 with a patterned circuit layer 31 formed on at least one surface thereof is provided. The circuit layer 31 defines a plurality of electrically connecting pads 310 and electroplating lines 311 connected to the electrically connecting pads 310. The circuit layer 31 can be made of Cu.

Figure 2C:
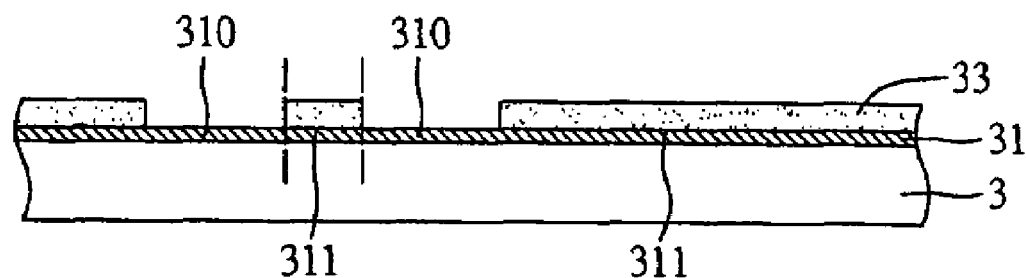

Referring to FIG. 2C, a patterned resist layer 33 is formed on the circuit layer 31 of the circuit board 3 with the electroplating lines 311 being covered by the patterned resist layer 33 and the electrically connecting pads 310 being exposed from the patterned resist layer 33. The resist layer 33 can be deposited on the circuit layer 31 through a printing process which uses a stencil having a plurality of grids. The resist layer 33 can also be patterned by exposure and development. Since the patterned resist layer 33 is directly formed on the circuit layer 31 of the circuit board 3, the resist layer 33 formed on the electroplating lines 311 between closely adjacent electrically connecting pads 310 is rather compact, and the bottom portion of the resist layer 33 is closely attached to the surface of the electroplating lines 311. Therefore, the electroplating material during the subsequent metal electroplating process is not easy to permeate into the electroplating lines 311 between closely adjacent electrically connecting pads 310.

Figure 2D:
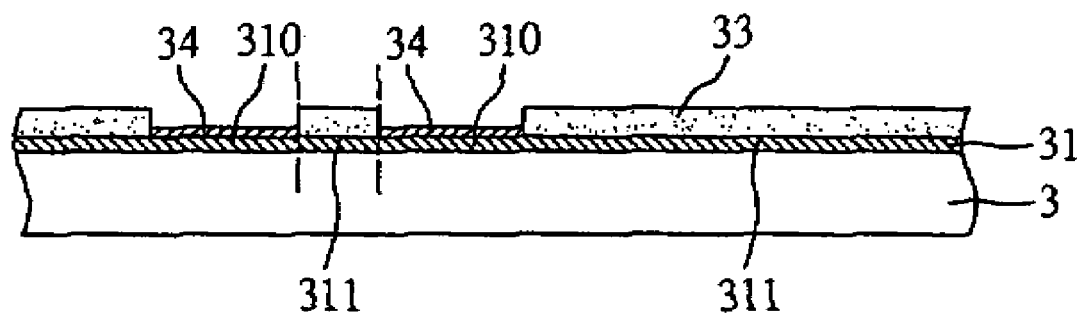

Referring to FIG. 2D, by using the electroplating lines 311 as a current conductive path, an electroplating process is performed so as to form a metal protection layer 34 on the electrically connecting pads 310 exposed from the resist layer 33. The metal protection layer 34 can be such as a Ni/Au layer.

Figure 2E:
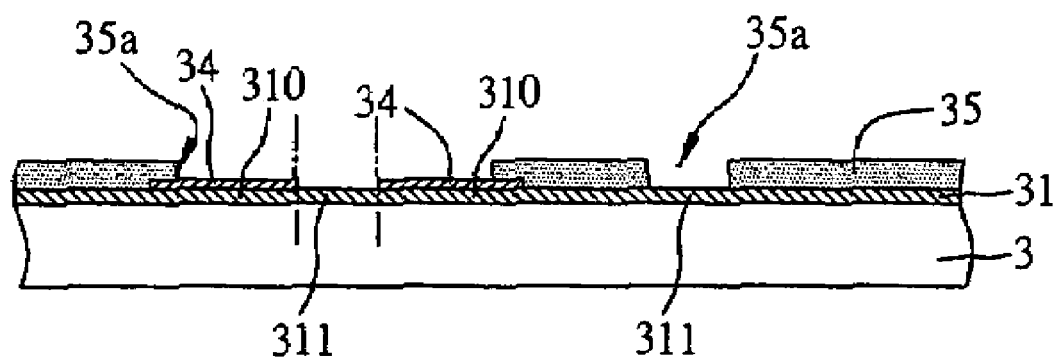

Referring to FIG. 2E, the resist layer 33 is removed through a physical or chemical process and a solder mask layer 35 is formed on the surface of the circuit board. The solder mask layer 35 has a plurality of openings 35a such that the electrically connecting pads 310 with the metal protection layer 34 thereon and the electroplating lines 311 can be exposed from the openings 35a of the solder mask layer 35. The solder mask layer 335 can be formed through a printing process, a spin coating process or an adhering process, and then patterned to form the openings 35a by exposure and development.

Figure 2F:
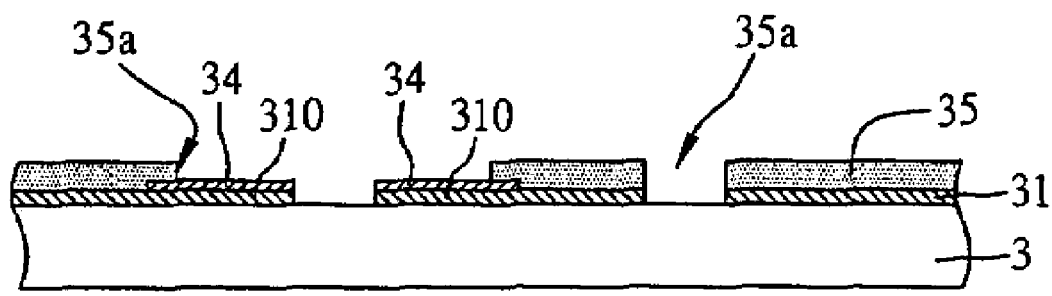

Referring to FIG. 2F, the electroplating lines 311 connecting the adjacent electrically connecting pads 310 are removed such that electrical connection between the electrically connecting pads 310 and the electroplating lines 311 can be cut off, thereby improving electrical performance of the circuit board and increasing product yield. Therein, the metal protection layer 34 covering the electrically connecting pads 310 can be used as an etching mask for protecting the electrically connecting pads 310 while the electroplating lines 311 are etched away.

According to the above fabrication method, a metal electroplating structure of an electrically connecting pad structure of a circuit board is provided, which comprises: a circuit board 3 with a patterned circuit layer 31 formed on at least one surface thereof, wherein the circuit layer 31 has a plurality of electrically connecting pads 310 and electroplating lines 311 connected to the electrically connecting pads 310; metal protection layers 34 formed on the electrically connecting pads 310 of the circuit board 34; and a solder mask 35 formed on the circuit board 3, wherein the metal protection layer 34 is partially exposed from the solder mask 35. The circuit layer can be made Cu and the metal protection layer can be a Ni/Au layer.

Thereafter, a semiconductor component can be mounted to the circuit board and electrically connected to an external device through the circuit board.

Therefore, according to the metal electroplating process of the present invention, a patterned resist layer is first formed on the circuit layer of a circuit board with the electrically connecting pads of the circuit layer being exposed by the patterned resist layer. Then, an electroplating process is performed by using the electroplating lines of the circuit layer as a current conductive path so as to form a metal protection layer on the electrically connecting pads. Thereafter, the patterned resist layer is removed and a solder mask layer is formed on the circuit board, wherein the electrically connecting pads with the metal protection layer thereon and the electroplating lines are exposed by the solder mask layer. Finally, the electroplating lines are removed such that electrical connection between the electrically connecting pads and the electroplating lines can be cut off, thereby ensuring electrical performance and signal transmission quality of the circuit board.

Since the resist layer formed on the circuit layer is rather compact and is closely attached to the electroplating lines, electroplating material is not easy to permeate into the electroplating lines during the electroplating process. Accordingly, the electroplating lines can easily be removed during the etching process so as to form a broken circuit between the electrically connecting pads and the electroplating lines. Thus, such phenomenon as short circuit can be prevented. Electrical performance of the circuit board is improved and the product yield is increased.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A metal electroplating process of an electrically connecting pad structure of a circuit board, comprising the steps of:
   providing a circuit board with a patterned circuit layer formed on at least one surface thereof, wherein the circuit layer defines a plurality of electrically connecting pads and electroplating lines connected to the electrically connecting pads;
   forming a patterned resist layer on the circuit layer of the circuit board with the electroplating lines being covered by the patterned resist layer and the electrically connecting pads being exposed from the patterned resist layer;
   performing an electroplating process so as to form a metal protection layer on the electrically connecting pads exposed from the patterned resist layer;
   removing the patterned resist layer;
   forming a solder mask layer on the circuit board, the electrically connecting pads with the metal protection layer thereon and the electroplating lines being exposed from the solder mask layer; and
   removing the electroplating lines not covered by the metal protection layer and yet exposed from the solder mask layer such that a broken circuit can be formed between the electrically connecting pads and the electroplating lines, wherein each of the end of the broken circuit of the electroplating lines is free of the metal protection layer.

2. The metal electroplating process of claim 1, wherein the metal protection layer is a Ni/Au layer.

3. The metal electroplating process of claim 1, wherein the solder mask layer is formed on the circuit board by one of a printing process, a spin coating process and an adhering process, and patterned by exposure and development.

4. The metal electroplating process of claim 1, wherein the circuit layer is made of Cu.

5. The metal electroplating process of claim 1, wherein the metal protection layer is used as an etching mask for protecting the electrically connecting pads covered by the metal protection layer while the electroplating lines exposed from the metal protection layer are etched so as to form the broken circuit between the electrically connecting pads and the electroplating lines.

6. A metal electroplating structure of an electrically connecting pad structure of a circuit board, comprising:
   a circuit board having a patterned circuit layer formed on at least one surface thereof, the circuit layer having a plurality of electrically connecting pads and electroplating lines connected to the electrically connecting pads, wherein the electrically connecting pad having an end of an electroplating line;
   metal protection layers formed on the electrically connecting pads, wherein the end of the electroplating line of the electrically connecting pad is free of the metal protection layers; and
   a solder mask layer formed on the circuit board, wherein the metal protection layer is partially covered by the solder mask layer, the metal protection layer is partially exposed from the solder mask layer, and the end of the electroplating lines of the electrically connecting pads is exposed from the solder mask layer.

7. The structure of claim 6, wherein the metal protection layer is a Ni/Au layer.

8. The structure of claim 6, wherein the circuit layer is made of Cu.

* * * * *